United States Patent [19]

Fletcher et al.

[11] 3,898,578

[45] Aug. 5, 1975

[54] INTEGRABLE POWER GYRATOR

[76] Inventors: James C. Fletcher, Administrator of the National Aeronautics and Space Administration with respect to an invention of; Erwin S. Hochmair, Vienna, Austria

[22] Filed: May 18, 1973

[21] Appl. No.: 361,666

[52] U.S. Cl. .................... 330/63; 330/18; 330/40; 330/13

[51] Int. Cl.$^2$ .................... H03F 9/00

[58] Field of Search .................... 330/63; 333/80 T

[56] References Cited

UNITED STATES PATENTS

| | | | |
|---|---|---|---|
| 3,400,335 | 9/1968 | Orchard et al. | 330/24 |
| 3,758,885 | 9/1973 | Voorman et al. | 333/80 T |
| 3,769,603 | 10/1973 | Herchner | 333/80 T X |

*Primary Examiner*—Nathan Kaufman
*Attorney, Agent, or Firm*—George J. Porter; L. D. Wofford, Jr.; John R. Manning

[57] ABSTRACT

A gyrator circuit operable at high power levels of the conventional configuration of two amplifiers in a circular loop, one producing zero phase shift and the other producing 180° phase reversal, in which the output of each of two differential amplifiers is connected to the junction of two, complementary transistors so that output operation is class B and in which each of the complementary transistors is connected to control two transistors in parallel, one of large conductive geometry and in a low resistance circuit and the other of small conductive geometry and in a resistance circuit connected as an input signal to one of the differential amplifiers. In a non-reciprocal embodiment only the input port accommodates high power. Greatly increased efficiency is realized.

10 Claims, 8 Drawing Figures

INTEGRABLE POWER GYRATOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 U.S.C. 2457).

BACKGROUND OF THE INVENTION

This invention relates to gyrator circuits and, more specifically, to such circuits having high efficiency with other desirable characteristics.

Gyrator circuits are circuits which reverse or invert the apparent effect of circuit elements and thereby produce one impedance while actually employing an element having the opposite impedance. Gyrators are now of great importance to produce inductance from capacitors rather than coils in integrated circuits, printed circuits, and the like since coils or similar elements are not readily produced in such circuitry, and, in fact, are quite impractical in some instances.

Gyrator technology is at present somewhat active, and includes various circuits employing voltage controlled current sources (VCCS), cascode configurations, darlington configurations, differential amplifiers and circuits employing conventional and field effect transistors. The underlying design of two amplifiers in a loop, one producing zero phase shift and the other producing 180° phase reversal, appears in various specific implementations.

But prior gyrators of all kinds have exhibited only a very low efficiency, in the order of 1%, and, therefore, can not be employed for signals of a power exceeding milliwatts without excessive dissipation of dc power.

Efficiency is considered to be defined by the ratio of the maximum gyrated signal power to the dissipated power. In the case of an active gyrator (where the transconductance exhibited at one input port does not equal the transconductance exhibited at the other port) the maximum efficiency is available at one port only.

Although efficiencies of actual circuits have been about 1%, in theory the maximum efficiency of a gyrator operating in class A and employing two gyration resistors is 12.5%.

High efficiency allows the handling of signals of considerable power with moderate dc power dissipation. Furthermore, high efficiency extends the range of gyrators to applications in which dc power is at a premium, such as battery operated equipment.

The quality factor, Q, is of basic importance in typical gyrator applications. Of all the various underlying design approaches, only the VCCS approach of amplifiers in a loop, one with phase reversal, characterized by high input and output resistances (which has been termed the Y-matrix) and to some extent, the closely related Z-matrix design, wherein the two gyrator terminals are directly connected with the amplifier output as well as the input, have led to dependable gyrators with satisfactorily high Q. In most cases the Y-matrix gyrator has proven to be superior with respect to Q and stability, but in a Z-matrix design described herein as one embodiment an extremely high Q is obtained.

The instant invention employs class B operation and parallel transistors of different conductive geometry. The design may be adapted so that only the input port accommodates (and thereby dissipates) high power.

From U.S. Pat. No. 3,448,411 (FIG. 3), class B operation is known generally and is employed in at least one gyrator circuit which is basically different in underlying design to that of the instant invention. Use of the parallel transistors of different conductive geometry is not known to have been used in prior gyrator technology. High Q factors such as attained by this design have been realized in only a few prior circuits, none having high efficiency.

SUMMARY OF THE INVENTION

It is a primary object of this invention to provide a power gyrator.

It is similarly a primary object of this invention to provide a gyrator of high power efficiency.

It is also an object of this invention to provide such a gyrator with high Q and satisfactory in other characteristics.

It is, more specifically, an object of this invention to provide a gyrator with efficiency up to 78.5%.

It is another, more specific object of this invention to provide a gyrator with high efficiency having a Q of 250 or more, depending upon the specific circuit design.

It is another object of this invention to provide a gyrator design which is relatively easy to construct by integrated circuit techniques.

It is, similarly, an object of this invention to provide a gyrator design which can be implemented in the same technology as conventional operational amplifiers.

A further advantage of the instant invention, in the case of the Y-matrix gyrator, is that a high output resistance is obtained as a result of a feedback to the differential amplifier, thereby making unnecessary the use of output stages having a high intrinsic output resistance, such as grounded emitter stages. In Y-matrix circuits, Q varies directly with output resistance of the output stage, and the high output resistance produced by the design of the instant invention contributes to Q where in prior Y-matrix circuits resistance of the output stage was the controlling factor.

In accordance with the instant invention, the output of at least one of the differential amplifiers of two amplifiers connected in a loop, one with phase reversal, as a gyrator, is connected to the junction of two transistors of complementary conductivity type so that one conducts signals of one polarity and the other conducts signals of the other polarity. Each of the complementary transistors controls two transistors connected in parallel, one of geometry for large conductivity and the other of geometry for small conductivity. Each of the transistors of small conductivity drives a gyrator resistor which produces a signal to the input of one of the differential amplifiers.

Both Y-matrix and Z-matrix embodiments are disclosed. Also disclosed are two specific, phase reversal circuits and specific darlington and grounded emitter output circuit structures.

In accordance with an aspect of this invention which is independent of the specific circuits disclosed, one high power amplifier is disclosed employed in the loop configuration in conjunction with a low current, low power consumption amplifier, whereby the power input and consumption is only at the amplifier adapted for high power.

Other objects, features, advantages, and characteristics of the invention will be apparent from the following description of preferred embodiments, as illustrated from the accompanying drawings.

DESCRIPTION OF THE PREFERRED EMBODIMENTS

Underlying Design and Optional System Feature

Figure 1:
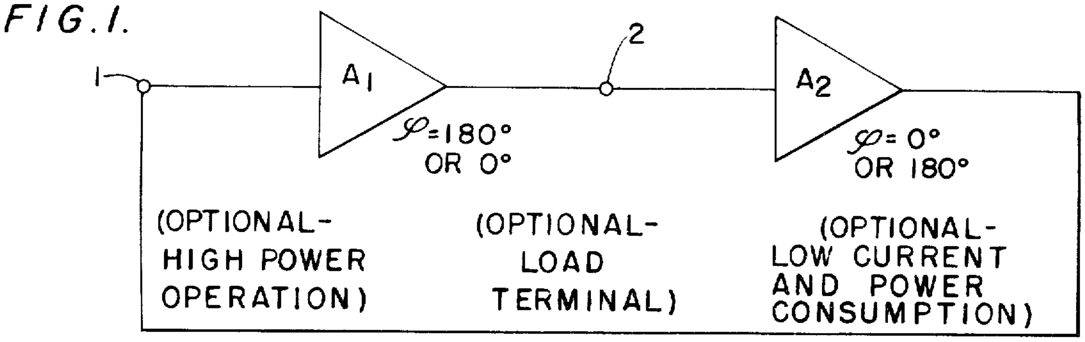
FIG. 1 illustrates generally the underlying design employed in this invention and also an optional system design by which power consumption is reduced.

As shown in FIG. 1, the basic circuit design comprises two amplifiers $A_1$ and $A_2$ (and circuit elements associated with them in a specific design) in a loop with one producing 180° phase reversal and the other producing zero phase change. This basic arrangement, with two essentially similar amplifier systems $A_1$ and $A_2$, is a conventional gyrator design.

The circuit is reciprocal, since the input signal may drive either the amplifier with phase reversal or the one without. Connection of an electrical element of a given kind at the terminal 1 or 2 in FIG. 1 causes the reciprocal element to effectively appear at the other terminal 1 or 2. For example, a conventional capacitor connected to terminal 2 results in an inductance appearing at terminal 1. The active elements in the circuits typically are either bipolar or field effect transistors.

An optional feature of the instant invention, which can yield significant savings in power lost, is also indicated in FIG. 1. This optional feature is applicable where only one port 1 or 2 of the gyrator has to accommodate high power signals, which is true in the important, typical cases in which an inductance or a transformer is to be simulated by a gyrator terminated by a capacitor at the other port.

The optional design is that of an active gyrator, meaning that the transconductance at the input of $A_1$ does not equal the transconductance at the input of $A_2$. In a specific embodiment, the amplifier $A_1$ is adapted to accommodate high power signals and the capacitor is connected to terminal 2. $A_2$ is a low power system of much smaller transconductance, but of voltage amplification equal to $A_1$.

In such a gyrator, the power consumption is mainly determined by the output stage at terminal 2, the high power port, and the efficiency of the whole gyrator approaches the efficiency of that one output stage.

Where $v_0$, the voltage amplification of $V_1$ and $V_2$, is 600, the gyrator, in accordance with the discussion below, has a Q of 300 and an efficiency, E, of approximately 38%. Improvements in detail can bring the efficiency closer to the theoretical limit of 78.5%.

The amplifiers $A_1$ and $A_2$, where this optional feature is employed in a specific design, preferably may be constructed in accordance with the designs discussed below.

Y-Matrix Gyrator—General Circuit

Figure 2:
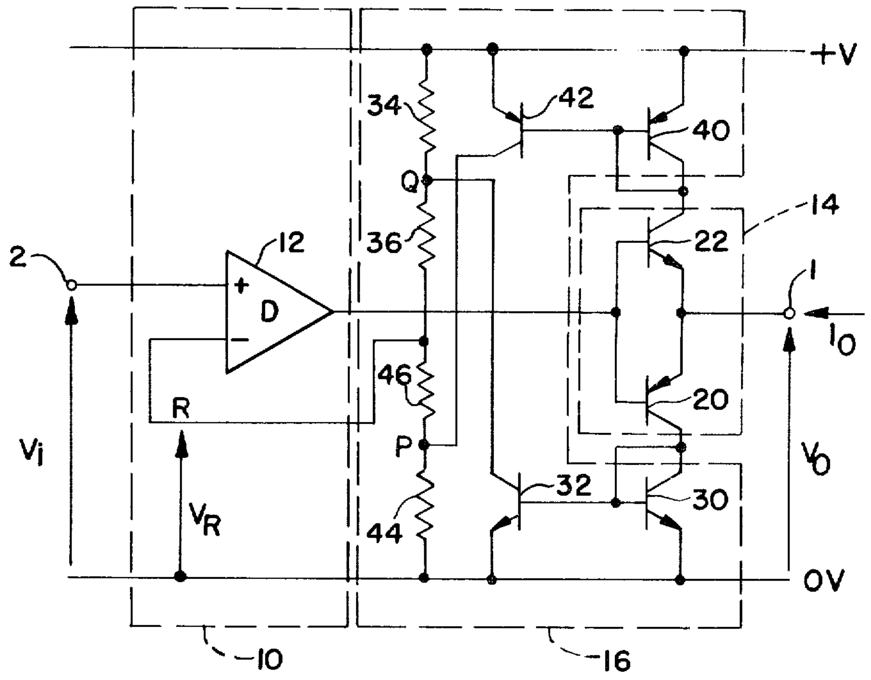
FIG. 2 is a simplified illustration of the basic preferred non-inverting voltage controlled current source for a Y-matrix gyrator.

FIG. 2 is a simplified schematic illustration of the basic preferred circuit of a non-inverting voltage controlled current source (VCCS) ($A_2$ in FIG. 1, when that amplifier is the non-inverting amplifier). The dotted outlines enclose the separate functional parts of the amplifier and associated elements: outline 10, which comprises differential amplifier 12; outline 14, the complementary output stage; and outline 16, the current/voltage converter. Because output stage 14 has complementary symmetry, push-pull, Class B operation is achieved.

The differential amplifier 12 may be of any type that offers a high common mode input range (from approximately zero volts to the maximum signal voltage) and a high input resistance. Field effect transistors have been employed in such amplifiers to provide high input resistance, but alternative designs and elements may also be employed.

The output stage 14 comprises at least two transistors, 20 and 22, of complementary transistor type. The bases of the transistors 20 and 22 are in common to the output of amplifier 12, and the transistors 20 and 22 are connected in emitter follower configuration to terminal 1.

The current/voltage converter 16 performs the same function as the ordinary gyration resistor in conventional gyrators such function being the production of a voltage proportional to the output current. This voltage is fed back as the second input to the differential amplifier 12, the other input being terminal 2. This type of feedback is a so called current-proportional voltage feedback which stabilizes the transconductance of the VCCS and at the same time enhances the output resistance at the output stage 14 and the input resistance of the differential amplifier 12.

The transistors 30 and 32 are connected to the OV source of potential for conduction in parallel. Their bases are connected jointly to the output of transistor 20 and the collector of transistor 30 is connected to the output of transistor 20. The collector of transistor 32 is connected to the junction of resistor 34 and resistor 36. The other terminal of resistor 36 is connected as the feedback input to amplifier 12.

The other circuit elements are symmetrical in structure and operation. Accordingly, the collector of transistor 40 is connected to transistor 22, and the bases of transistors 40 and 42 are connected together and to the output of transistor 22, with the emitters of transistors 40 and 42 connected to a source of reference potential +V. The output of transistor 42 is connected to the junction of resistors 44 and 46. Resistor 44 is connected to OV and resistors 44, 46, 36, and 34 are in a series circuit, with resistor 34 connected to +V.

Where two transistors are connected for conduction in parallel, with bases joined, and the transistors are of the same geometry with regard to factors controlling conduction of current, they are said to form a current mirror and their collector currents would tend to be equal.

In the instant circuit, however, transistor 30 is of larger conductive geometry than transistor 32, (i.e., the current gain of transistor 30 exceeds the current gain of transistor 32), and the same is true for the symmetrical circuit of transistors 40 and 42. Therefore, the collector current of each of transistors 32 and 42 tends to be smaller than the current each of the respective transisters 30 or 40 by a factor $1/n$ where $n$ is termed the current scaling factor. Since the lower current in transistors 32 and 42 necessarily results in reduced power losses in resistors 34 and 44, power loss is reduced by the same factor: $1/n$.

Accordingly, to enhance efficiency, $n$ is made relatively large—between 7 and 10 being considered adequate. Resistors 36 and 46 are not to carry significant current in the operation of the circuit and are therefore of relatively large magnitude.

In operation, the output stage 14 functions in class B, which reduces power consumption and only $1/n$ part of the output current, $I_o$, flows through and produces power in the gyrator resistors 34 and 44, which also reduces power consumption since no other major power consuming elements are in the circuit. Current flowing in the operation of the differential amplifier 12 and the transistors 32 and 42 is small compared to $I_o$.

In the class B operation, only one of the transistors 20 and 22 draws current at a time, the other being back biased by the signal from amplifier 12. Thus, in the positive halfwave of $I_o$, $I_o$ current flows through transistors 20 and 30, and in the negative halfwave, $I_o$ current flows through transistors 22 and 40.

The positive halfwave of the output current, $I_o$, through transistor 30 is accompanied by a proportionally smaller current $I_o/n$ through transistor 32, which produces a voltage drop across resistor 34. During the negative halfwave the collector current of transistor 30 is zero, and no associated voltage drop is developed across resistor 34, but the voltage at the junction of resistors 44 and 46 appears from the transistors 40 and 42 in the same manner as described. Similarly, during the positive halfwave the collector current of transistor 42 is zero.

The dc current produced by the series circuit of resistors 34, 36, 46 and 44 is negligible as compared to $I_o/n$ because resistors 36 and 46 are so relatively large.

Figure 3:
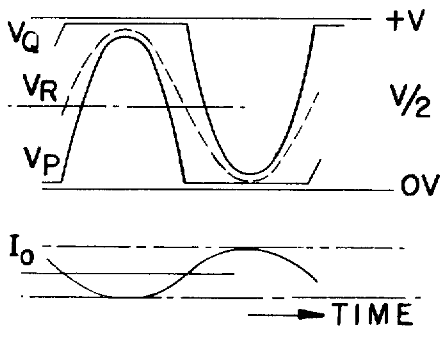
FIG. 3 illustrates the voltage at certain labeled points in the circuit of FIG. 2.

FIG. 3 illustrates the voltage during the time progression of $I_o$ at the junction of resistors 34 and 36, denominated Q, the junction of resistors 44 and 46, denominated P, and at the junction of resistors 36 and 46, the feedback input to amplifier 12, denominated R. Since resistors 36 and 46 are relatively large and are of equal magnitude, the voltage change at the junction, the point R, is essentially one half the sum of the voltage at the points Q and P.

By conventional circuit analysis of the circuit of FIG. 2 just described, the following results can be shown:

$$\text{Transconductance } (g) = -\frac{v_o}{R_o + \frac{v_o R_f}{2n}}$$

$$\text{Input resistance } (R_i) = R_{id}\left(1 + \frac{v_o \cdot R_f}{(R_L + R_o) \cdot 2n}\right)$$

$$\text{Output resistance } (R_o) = R_{os} + v_o \frac{R_f}{2n}$$

Where:

$v_o$ = voltage gain of the differential amplifier 12.

$R_{id}$ = input resistance of the differential amplifier 12.

$R_{os}$ = output resistance of the output stage 14.

$R_f$ = resistance of 34 or 44 (same value).

$n$ = ratio of conductive geometry characteristics discussed above (also termed current scaling factor).

$R_L$ = resistance of load.

In all practical cases $R_{os}$ is negligibly smaller than $v_oR_f/2n$. Therefore, $$g = -\frac{2n}{R_f}$$

$$R_i = \frac{v_o R_{id}}{R_L + R_o} \cdot \frac{R_f}{2n}$$

$$R_o = v_o \frac{R_f}{2n}$$

The efficiency, E, of the single VCCS stage of FIG. 2 is:

$$E = \frac{\pi}{4} \frac{1-s}{1+\frac{2}{n}}$$

Where:

$$s = 2\frac{V_{sat}}{V_s}$$

and $V_s$ is the supply voltage, and $V_{sat}$ is the saturation voltage of the output stage.

Power dissipation of the differential amplifier 12 is not included above since by proper design it can always be made negligible.

For large $n$, the efficiency of the VCCS stage approaches that of the standard class B stage, $\pi/4(1\text{-}s)$, and where the supply voltage is very large compared to $V_{sat}$, efficiency approaches $\pi/4$ or 78.5%. The value of $n$, which is the ratio of the collector current in each of transistors 32 and 42 to the collector current in each of transistors 30 and 40, is selected to provide an efficiency E arbitrarily close to the efficiency $\pi/4(1\text{-}s)$ of a standard Class B stage.

Y-Matrix—Detailed Circuit

Figure 4:
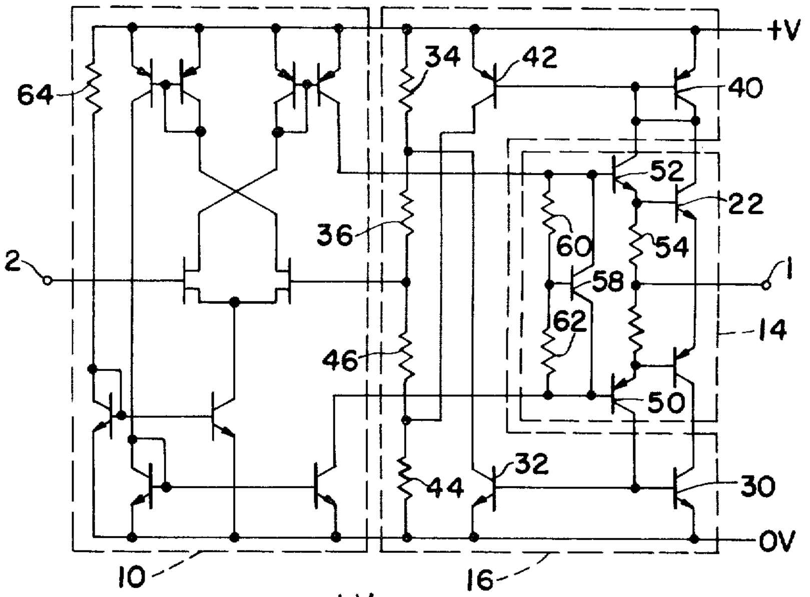
FIG. 4 shows the details of the Y-matrix amplifier circuit design shown in FIG. 2.

FIG. 4 shows the details of a specific circuit designed in accordance with the general features of FIG. 2. The dotted outlines 10, 14 and 16 denote the same assemblies as in FIG. 2.

The differential amplifier stage 10 will not be discussed in detail since it is essentially a conventional design. Field effect transistors are used at the input in order to obtain high input impedance, but other techniques from operational amplifier design such as darlington input or super beta transistors may be utilized.

The output stage 14 comprises a darlington circuit with the base of transistor 20 connected to the emitter of transistor 50, and, similarly, a darlington circuit made up by the base of transistor 22 connected to the emitter of transistor 52. The collectors of transistors 20 and 50 are connected together and the collectors of transistors 22 and 52 are also connected.

One terminal from differential amplifier 10 is connected to the base of transistor 52, from the emitter of transistor 52 to resistor 54, through resistor 54 to terminal 1 and to resistor 56, through resistor 56, to the emitter of transistor 50, and from the base of transistor 50 to the other terminal of differential amplifier 10. The junction of transistors 20 and 22 is also connected to terminal 1. Transistor 58, poled to conduct current in parallel with transistors 52 and 50, is connected across the bases of transistors 52 and 50. Resistors 60 and 62 are in parallel with transistor 58 across transistor 52 and 50 with their junction connected to the base of transistor 58. The entire circuit of FIG. 4 is essentially symmetrical in construction and operation with respect to the mid-point of amplified signals.

In operation, the output stage operates as darlington circuits, and transistor 58 as biased by resistors 60 and 62 sets the operating point as class B.

In an actual test circuit built using discrete transistors, resistor 64 (in the differential amplifier 10) was 50K ohms, resistors 34 and 44 each was 5.6K ohms, resistors 36 and 44 each was 100K ohms, resistors 54 and 56 each was 2.2K ohms, and $n$ was 5. The supply voltage, +V, was 10 volts.

Measured results were as follows: voltage amplification factor, $v_o$, was 600; transconductance, $g$, was 1.8 mS; output resistance, $R_o$, was 300K ohms; input resistance, $R_i$, was much, much greater than the output resistance of another such amplifier system in a gyrator loop; and efficiency, E, was 38%.

Since $V_{sat}$ was 1.6 volt, the supply voltage of 10 volts was relatively low ($s$ was 0.32), which was the main reason that the measured efficiency was not closer to the theoretical limit. Another significant reason was the relatively low value of $n$, 5.

Associated Inverting Circuits

The inverting VCCS typically is essentially similar to the non-inverting VCCS. In order to invert the phase in the circuit described in FIG. 4, the inputs of the differential amplifier 10 are simply interchanged.

In such a circuit, the feedback must remain negative in sense. A first preferred circuit arrangement to achieve this is shown in FIG. 5.

Figure 5:
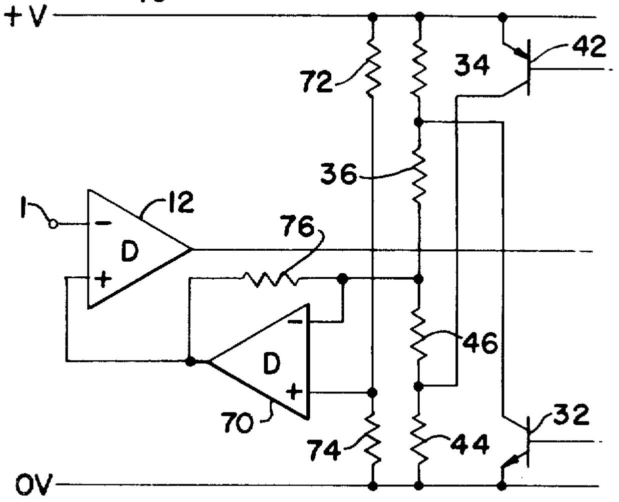
FIG. 5 illustrates a preferred circuit arrangement for an inverting voltage controlled current source according to the present invention.

The circuit of FIG. 5 comprises the same elements as described including transistors 32 and 42 and the series resistors 34, 36, 46, and 44, shown in the drawing. The junction of resistors 36 and 46 is connected to one input of an added differential amplifier 70. Two resistors 72 and 74 are connected in series between +V and OV sources and their junction is connected as the other input of differential amplifier 70, thereby providing a reference voltage to that input. A resistor 76 is connected across the first input to amplifier 70 and the output. The three new resistors 72, 74, and 76 are each of half the magnitude of resistance as the value of resistors 36 or 46 (which are of the same value).

The amplification factor of amplifier 70 is minus 1, and the output of amplifier 70 is one input to the defferential amplifier 12 of the inverting VCCS. The other input is terminal 1.

Figure 6:
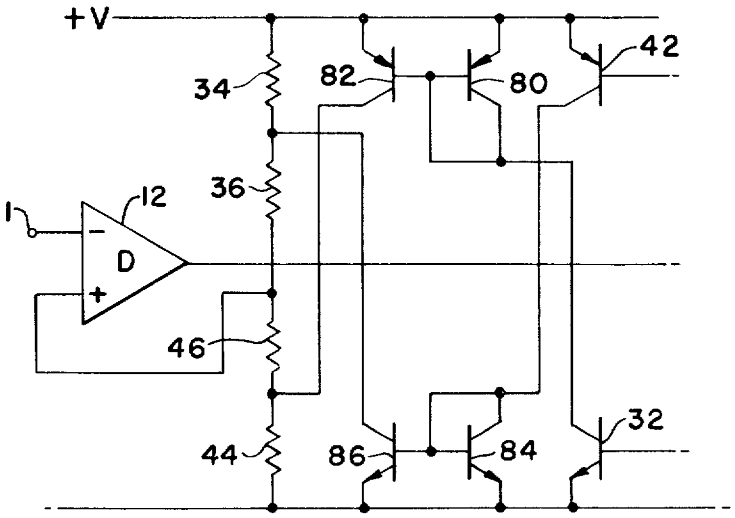
FIG. 6 illustrates an alternative circuit arrangement to obtain phase inversion of the feedback signal in the inverting VCCS.

A possible alternative circuit for inversion of the feedback is shown in FIG. 6. The circuit comprises the same elements as described for the basic VCCS including transistors 32 and 42 and the series resistors 34, 36, 46, and 44, shown in the drawing. The output of transistor 32 connects to the bases of transistors 80 and 82, which form a current mirror. The emitters of transistors 80 and 82 are connected directly to +V. The collector of transistor 80 is connected to the collector of transistor 32, while the collector of transistor 82 is connected to the junction of resistors 46 and 44, thereby producing a signal at the junction of resistors 36 and 46 during half of the signal cycle which is inverted from that of the previous embodiment. The configuration of transistors 84 and 86 is entirely symmetrical and operates as described to present an inverted signal during the other half of the signal.

Q and Efficiency of Y-Matrix Gyrator

Referring to the formulas previously developed, where $n_1$ is the conductive geometry factor for VCCS 1 and $n_2$ is the conductive geometry factor for the other VCCS, 2, and where resistors 34 and 44 are the same magnitude, $R_{f2}$ in VCCS 2 and $R_{f1}$ in VCCS 1, then:

$$g_2 = \frac{2n_2}{R_{f2}} \qquad g_1 = \frac{-2n_1}{R_{f1}}$$

$$R_{o1} = v_o \frac{R_{f1}}{2n_1} \qquad R_{o2} = v_o \frac{R_{f2}}{2n_2}$$

Accordingly, a gyrator comprising the non-inverting and inverting VCCS as described above has the following admittance matrix parameters:

$$g_{21} = \frac{2n_2}{R_{f2}}$$

$$g_{12} = \frac{-2n_1}{R_{f1}}$$

$$g_{11} = \frac{2n_1}{v_o R_{f1}}$$

$$g_{22} = \frac{2n_2}{v_o R_{f2}}$$

This establishes a low frequency quality factor, Q, of $V_o/2$. Accordingly, relatively high Q circuits are readily available, and the efficiency may approach the theoretical limit of 78.5% as established above for one VCCS.

Where the two VCCS circuits have equal transconductance (i.e., the absolute value of $g_{12}$ equals the absolute value of $g_{21}$), the efficiency of the gyrator amounts to one half of the efficiency of a single amplifier system. But where, as discussed in connection with FIG. 1, only one of the amplifier systems is a power amplifier, the efficiency of the gyrator itself may approach the theoretical limit of 78.5%.

Grounded Emitter Output Stage

Figure 7:
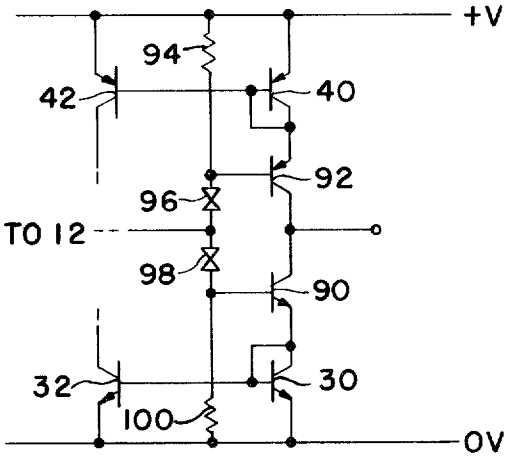
FIG. 7 shows an alternative output stage for the emitter follower of FIG. 2.

FIG. 7 shows an alternate output stage which may replace the emitter follower output stage 14 of FIG. 2. The output stage comprises two, complementary transistors 90 and 92, with the emitter of transistor 90 connected directly to the collector of transistor 30 and the emitter of transistor 92 connected symmetrically to transistor 40.

One end of resistor 94 is connected to +V and the other end to Zener diode 96. That junction is also connected to the base of transistor 92. The other end of Zener diode 92 is connected to the output of differential amplifier 12 and to one end of Zener diode 98. Diode 98 and resistor 100 are connected to be symmetrical to the resistor 94 and diode 96, with the end of resistor 100 connected to OV.

The Zener diodes are poled to impede operation other than class B and thereby ensure class B biasing. The advantage of this output configuration is its high inherent output resistance, $R_s$, which adds directly to the output resistance $v_o (R_f/2n)$ obtained by feedback, so that the output resistance of the VCCS is $R_s + v_o(R_f/2n)$.

The high output resistance contributes to a higher Q of the gyrator. Furthermore, because of the higher output resistance, the gain can be concentrated in the output stage, thus eliminating the high impedance node within the VCCS. This results in a greater usable frequency range. These advantages in various applications may well justify the more complicated biasing.

Z-Matrix Gyrator

Figure 8:
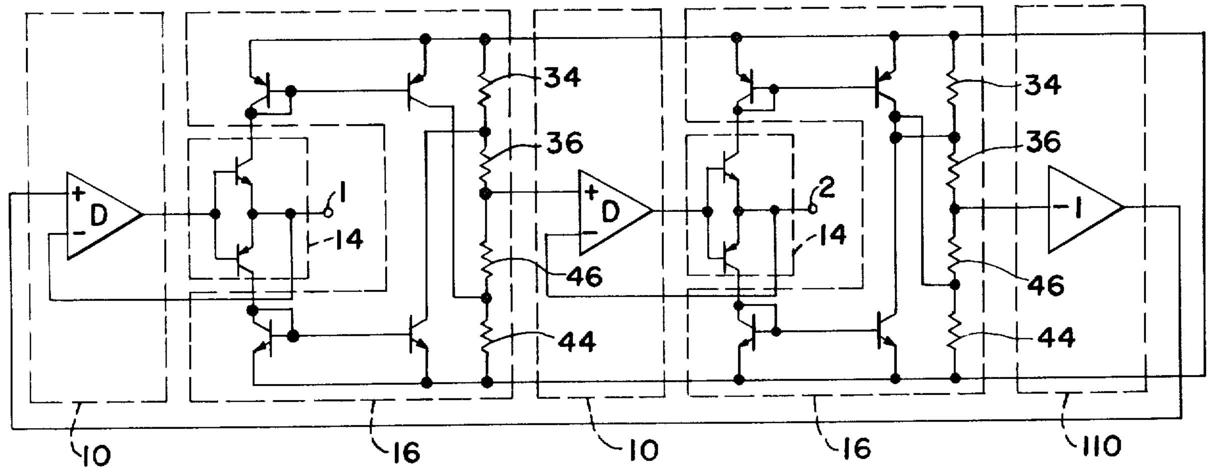
FIG. 8 shows a Z-matrix gyrator according to the present invention.

As shown in FIG. 8, the basic building blocks of the Y-matrix gyrator, the differential amplifiers 10; the complementary output stages 14; the voltage/current converters, 16; and an inverter 110 are combined somewhat differently to form a Z-matrix gyrator. The Z-matrix gyrator has a low output resistance and a high input resistance, obtained by a feedback of the voltage at each terminal 1 and 2 to the inverting input of the corresponding differential amplifier 10.

As is the case of the Y-matrix gyrator, the output of each differential amplifier 10 is connected to an associated complementary output stage 14, which in turn is connected to an associated current/voltage converter 16. One of the amplifying systems is inverting and one is non-inverting.

The current/voltage converter 16 produces a voltage that is proportional to the current flowing into the associated port (1 or 2) of the gyrator. In the Z-matrix gyrator, this voltage is not fed back to the differential amplifier 10, but drives the non-inverting input of the other differential amplifier 10, either directly in one case or, for the other amplifier system, by insertion of an inverter 110 (voltage gain minus 1) between the output of one of the amplifier systems and the input to the other. The inverter 110 may be essentially as described in connection with FIGS. 5 and 6.

Assuming a large voltage gain $v_o$ of each of the differential amplifiers, which is always valid in a high quality gyrator, the impedance parameters of the Z-matrix gyrator become:

$$Z_{21} = -\frac{R_{f1}}{2n_1}$$

$$Z_{12} = \frac{R_{f2}}{2n_2}$$

$$Z_{11} = \frac{R_s}{v_o}$$

$$Z_{22} = \frac{R_s}{v_o}$$

Where: $R_s$ = intrinsic output resistance of the output stages 14

Therefore, the quality factor, Q, is the following, which can be quite high in practice.

$$Q = \frac{v_o}{4}\frac{\sqrt{\frac{R_{f1}R_{f2}}{n_1 n_2}}}{R_s}$$

The efficiency of the Z-matrix gyrator is equal to that of the corresponding Y-matrix gyrator. No investigations as to stability have been made.

As a specific example, assuming the circuit elements to have the same value as in the corresponding Y-matrix gyrator, as follows:

$$v_o = 600,\ \frac{R_{f1}}{n_1} = \frac{R_{f2}}{n_2} = 1.1\text{K ohms},$$

and $R_s$ = 125 ohms, the Q obtained is 1300, which is, of course, very high compared with typical gyrators.

CONCLUSION

Other variations of the invention described will be apparent, and variations may well be developed which employ more than ordinary skill in this art, but nevertheless employ the basic contribution and elements of this invention. Accordingly, patent protection should not be essentially limited by the preferred embodiments disclosed, but should be as provided by law with particular reference to the accompanying claims.

What is claimed is:

1. A gyrator circuit comprising two voltage-controlled-current-sources (VCCS's) connected in a loop, one of the VCCS's producing a 180° phase change and termed the inverting VCCS, and the other producing a 0° phase change and termed the non-inverting VCCS, the non-inverting one of the VCCS's comprising: a differential amplifier having a pair of input terminals, one of which constitutes the input to the non-inverting VCCS; a complementary output stage driven by the output of the differential amplifier for producing the output of the non-inverting VCCS and driving the inverting VCCS; and a current-to-voltage converter responsive to the output stage of the non-inverting VCCS for producing a feedback voltage that is applied to the other of the pair of input terminals to the differential amplifier of the non-inverting VCCS.

2. A gyrator according to claim 1 wherein the current-to-voltage converter of the non-inverting VCCS comprises: a resistor network connected from one side of a voltage source to the other and having a node that establishes the feedback voltage of the converter; two pairs of current mirror transistors respectively connected to different sides of the source; one transistor of each pair being connected to opposite sides of the complementary output stage of said non-inverting VCCS and having a conductive geometry larger than the conductive geometry of the other of such pair which is connected to the network.

3. A gyrator circuit according to claim 2 wherein the complementary output stage of the non-inverting VCCS comprises a pair of complementary conductivity transistors whose emitters are connected together to define the output of the non-inverting VCCS and whose bases are connected together to the output of the differential amplifier of the non-inverting VCCS, the collectors of the pair of transistors being connected to the current-to-voltage converter of the non-inverting VCCS.

4. A gyrator circuit according to claim 3 wherein each pair of complementary conductivity transistors comprises a Darlington pair of transistors.

5. A gyrator circuit according to claim 1 wherein the inverting VCCS comprises a differential amplifier having a pair of input terminals, one of which constitutes the input to the inverting VCCS; a complementary output stage driven by the output of the last mentioned differential amplifier for producing the output of the inverting VCCS and driving the non-inverting VCCS; a current-to-voltage converter responsive to the output stage of the inverting VCCS for producing a feedback voltage; and a phase inverter for inverting the last mentioned feedback voltage and applying the inverted voltage to the other of the pair of input terminals of the differential amplifier of the inverting VCCS.

6. A gyrator according to claim 5 wherein the current-to-voltage converter of the inverting VCCS comprises: a resistor network connected from one side of a voltage source to the other and having a node that establishes the feedback voltage of the converter; two pairs of current mirror transistors respectively connected to different sides of the source; one transistor of each pair being connected to opposite sides of the complementary output stage of said inverting VCCS and having a conductive geometry larger than the conductive geometry of the other of such pair which is connected to the network.

7. A gyrator circuit according to claim 6 wherein the complementary output stage of the inverting VCCS comprises a pair of complementary conductivity transistors whose emitters are connected together to define the output of the inverting VCCS and whose bases are connected together and to the output of the differential amplifier of the inverting VCCS, the collectors of the pair of transistors being connected to the current-to-voltage converter of the second VCCS.

8. A gyrator according to claim 7 wherein each pair of complementary conductivity transistors comprises a Darlington pair of transistors.

9. A gyrator circuit according to claim 6 wherein the phase inverter comprises a feedback differential amplifier to one input of which is applied the feedback signal and to the other input of which is applied a reference voltage, a feedback resistor being interconnected between the one input to the feedback differential amplifier and the output thereof, which output constitutes the inverted feedback signal.

10. A gyrator according to claim 6 wherein the phase inverter comprises a third pair of complementary transistors connected across the source and biased by the network and a fourth pair of complementary transistors, each of which is connected to the source and to different ones of the third pair of transistors, each of the fourth pair of transistors being connected to a transistor of the first pair having the opposite conductivity.

* * * * *